US008445899B2

(12) United States Patent
Murayama et al.

(10) Patent No.: US 8,445,899 B2
(45) Date of Patent: May 21, 2013

(54) ORGANIC ELECTRONIC PANEL AND METHOD FOR MANUFACTURING ORGANIC ELECTRONIC PANEL (75) Inventors: Masaaki Murayama, Hachioji (JP); Kazuo Genda, Hachioji (JP); Takahiko Nojima, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/255,851

(22) PCT Filed: Feb. 12, 2010

(86) PCT No.: PCT/JP2010/052045
§ 371 (c)(1),
(2), (4) Date: Sep. 9, 2011

(87) PCT Pub. No.: WO2010/106853
PCT Pub. Date: Sep. 23, 2010

(65) Prior Publication Data
US 2011/0315977 A1    Dec. 29, 2011

(30) Foreign Application Priority Data

Mar. 16, 2009  (JP) .................................. 2009-062888
Dec. 9, 2009   (JP) .................................. 2009-279222

(51) Int. Cl.
*H01L 29/08*   (2006.01)
*H01L 33/00*   (2010.01)
*H01L 21/00*   (2006.01)
*H01L 21/4763* (2006.01)
*H01L 21/44*   (2006.01)

(52) U.S. Cl.
USPC ............. 257/40; 257/103; 438/624; 438/652; 438/118

(58) Field of Classification Search
None
See application file for complete search history.

(56) References Cited

U.S. PATENT DOCUMENTS

| 6,700,185 B1 * | 3/2004 | Kawai et al. ................. 257/668 |
| 2009/0054641 A1 * | 2/2009 | Kitamura et al. ............. 540/128 |

FOREIGN PATENT DOCUMENTS

| JP | 2192691 A | 7/1990 |
| JP | 2001043970 A | 2/2001 |
| JP | 2002093573 A | 3/2002 |
| JP | 2004171806 A | 3/2002 |
| JP | 2003168555 A | 6/2003 |
| JP | 2006299145 A | 11/2006 |
| JP | 2009054606 A | 3/2009 |
| WO | 2007123006 A1 | 11/2007 |
| WO | WO 2007123006 A1 * | 11/2007 |

* cited by examiner

*Primary Examiner* — Julio J Maldonado
*Assistant Examiner* — Harpreet Singh
(74) *Attorney, Agent, or Firm* — Lucas & Mercanti, LLP (57) ABSTRACT

Provided is an organic electronic panel wherein warping (deformation) of a metal member is suppressed when the metal member is used as a packaging board, an electrical short-circuit due to the warping is eliminated, and generation of light emission failure and deterioration of power generating performance are eliminated. In the organic electronic panel, the packaging board is composed of a metal foil, and a polymer film is laminated on the metal foil surface on the reverse side of the side having the adhesive layer. The thickness of the polymer film is not more than that of the metal foil, and heat is applied at the time of bonding/laminating the packaging board or at the time of hardening the adhesive layer.

9 Claims, 1 Drawing Sheet

FIG. 1

PRIOR ART

FIG. 2

ORGANIC ELECTRONIC PANEL AND METHOD FOR MANUFACTURING ORGANIC ELECTRONIC PANEL

CROSS REFERENCE TO RELATED APPLICATION

This is a 371 of PCT/JP2010/052045 filed Feb. 12, 2010, which in turn claimed the priority of Japanese Patent Application Nos. 2009-062888 filed Mar. 16, 2009 and 2009-279222 filed Dec. 9, 2009, all of the applications are incorporated by reference herein.

TECHNICAL FIELD

The present invention relates to a method for manufacturing an organic electronics panel which has resolved failures, such as an electrical short-circuit at a sealing edge portion at the time of hardening a sealant, and warping and exfoliation of the substrate, wherein the organic electronics panel is sealed by pasted together with a sealing substrate (a metal foil having conductivity).

BACKGROUND

The present field is related to sealing of an organic electronics panel which is composed of an organic electroluminescence element or an organic photoelectric conversion element. In an organic electroluminescence element, moisture sorption of a material composing a light emitting layer, or moisture sorption of a light emitting unit will spoil the luminescent brightness remarkably. Moreover, in an organic photoelectric conversion element, moisture sorption of a material, composing a power generation layer, or moisture sorption of a power generation will spoil power generation performance. Therefore, it is necessary to lower the humidity inside an organic electroluminescence element organic EL element) or an organic photoelectric conversion element, and there has been provided a means for carrying out cutoff protection of an inside of the element from an outside air. For example, there has been disclosed a method of casing type in which a glass cap or a metal can is used with an adhesive agent for sealing to form a hermetic space and a desiccant is installed therein. Moreover, in recent years, there has been disclosed a method of close adhesion type in which after forming an organic light, emitting layer on a plastic or glass substrate, a high barrier film or a metal foil which is flexible and thin is adhered on the surface of the element using an adhesive agent to seal. Thus, an organic photoelectric conversion element excellent in moisture resistance, thinness and light emission has been proposed.

Since gas permeability is low and cheap as a sealing component, metals (a plate or a foil) are applied in many cases. However, since metal has conductivity, an electric short circuit will occur by contact with an organic EL element or a taking-out electrode. Thereby, it will produce a problem such as poor luminescence and insufficient uniform luminescent characteristic. There have been proposed various methods. Moreover, when an organic photoelectric conversion element was used similarly, it was revealed that it is easy to induce a leakage defect at the time of generation of electric power.

Moreover, a method of improvement in handling in a sealing process or prevention of wrinkles has been proposed by appropriately using hard and elastic aluminium foil for different tasks.

To the occurrence of electric short-circuit when using a high conductive metal component is used for a sealing component, there has been proposed a method to secure a clearance (a contact limit or a gap) by mixing a spacer of a particle form in an adhesive layer between a substrate and a sealing component.

However, since the adhesive layer becomes thick by the thickness of the spacer used in this method, water and the oxygen gas in the air will permeate easily into the sealing, and sealing performance will be decreased. Moreover, there is also cost increase by the spacer.

Although there has been proposed a method to arrange a resin layer on the surface of the metal component (one side or both sides) to perform an insulation treatment to it, for dealing with this problem (for example, refer to Patent documents 1 and 2), there may occur the case in which short-circuit is induced by contact with the edge portion of the sealing component. A current status is not having resulted yet in a fundamental remedy. Moreover, it became clear that there will occur the phenomenon in which the sealing substrate will be warped to the electrode side by cure shrinkage of the adhesive layer and the edge portion of the adhesive layer will contact to the electrode short-circuit).

Moreover, to install an insulating layer at the edge portion may be difficult from the viewpoint of process, or it may result in increase of cost. Further, when an insulation process is performed by using a resin layer, there may be also gas trespass (side leak) from the edge portion of the resin layer, and sealing performance will be decreased. Furthermore, cloudiness may occur at the adhesion portion and peeling of an interface may occur, and quality degradation may be produced. It is feared that an edge portion of the sealing component may produce exposed short-circuit.

In addition, when a metallic foil is used for a sealing component (substrate), there are also problems of a pinhole and wrinkles during handling and various studies have been made. For example, improvement in handling and wrinkles prevention are investigated by hard aluminium foil (for example, Patent document 3). However, a fundamental remedy has not been achieved yet.

PRIOR ART DOCUMENTS

Patent Documents

Patent document 1: JP-A No. 2001-43970
Patent document 2: JP-A No. 2002-93573
Patent document 3: JP-A No. 2004-171806

SUMMARY OF THE INVENTION

Problems to be Resolved by the Invention

An object of the present invention is to control the warping (deformation) of the component when a metal component is used for a sealing component, to prevent the electric short-circuit by this, and to prevent occurrence of poor luminescence and appearance of leak at the time of generation of electricity.

Means to Solve the Problems

The above-mentioned problems of the state of the art are resolved by the following means.
1. An organic electronics panel formed by pasting and laminating a sealing substrate via an adhesive layer on an organic electronics element comprising a substrate having thereon at least: an anode layer including a first electrode; an organic layer; and a cathode layer including a second electrode, wherein the sealing substrate is composed of a metal foil, a polymer film being laminated on a reverse side of the metal foil opposite a side of the metal foil contacting the adhesive layer; a thickness of the polymer film is not more than a thickness of the metal foil; and heat is applied at a time of pasting and laminating the sealing substrate, or at a time of hardening the adhesive layer.

2. The organic electronics panel of the aforesaid item 1, wherein the organic layer includes a light emitting layer, and the organic electronics element is an organic electroluminescence element.

3. The organic electronics panel of the aforesaid item 1, wherein the organic layer includes an photoelectric conversion layer, and the organic electronics element is an organic photoelectric conversion element.

4. The organic electronics panel of any one of the aforesaid items 1 to 3, wherein the thickness of the metal foil is 9 to 500 µm, and the thickness of the polymer film is 10 to 100% of the thickness of the metal foil.

5. The organic electronics panel of any one of the aforesaid items 1 to 4, wherein the metal foil is made of aluminium.

6. The organic electronics panel of any one of the aforesaid items 1 to 4, wherein the metal foil is made of aluminium, and the side of the metal foil contacting the adhesive layer is a glossy surface.

7. The organic electronics panel of any one of the aforesaid items 1 to 4, wherein Tg of the polymer film is lower than the temperature at the time of pasting and laminating the sealing substrate, or at the time of hardening the adhesive layer.

8. The organic electronics panel of any one of the aforesaid items 1 to 4, wherein a heat shrinking ratio of the polymer film is 0.2 to 3% at the time of pasting and laminating the sealing substrate, or at the time of hardening the adhesive layer.

9. A method for producing the organic electronics panel of any one of the aforesaid items 1 to 8.

Effects of the Invention

By the present invention, the warping (deformation) of the component caused by the cure shrinkage of the adhesive layer at the time of carrying out sealing using metal a component can be controlled, and a short-circuit with a taking out electrode can be prevented.

According to the present invention, it is not necessary to mix a spacer in the sealant for sealing and, and occurrence of a short-circuit can be prevented even with a small gap.

Moreover, since a seal gap can be narrowed, the gas penetration from a sealing portion is suppressed and sealing performance is improved. Further, a thin-type panel can be attained.

Moreover, occurrence of a short-circuit can be controlled in a sealing portion without preparing an insulating layer in a sealing component. Cost reduction can be realized because an insulating layer is not required to be given, though, an insulating layer may be given.

When a metallic foil is used, handling of a metallic foil becomes easy by laminating a polymer film on the metallic foil, and the problems such as generation of a pinhole can also be controlled.

EMBODIMENTS TO CARRY OUT THE INVENTION

The present invention is concerned with an organic electroluminescence panel and an organic photoelectric conversion panel (they are called an organic electronics element including both), provided that an organic electroluminescence panel contains an organic electroluminescence element (it is called as an organic EL element) comprising a substrate having thereon at least: an anode layer including a first electrode; an organic layer including a light emitting layer; and a cathode layer including a second electrode, and an organic photoelectric conversion panel contains an organic photoelectric conversion comprising a substrate having thereon: an anode layer including a first electrode; an organic layer including a photoelectric conversion layer; and a cathode layer including a second electrode. An organic electronics panel of the present invention is produced by pasting and laminating a sealing substrate via an adhesive layer on an organic electronics element. The organic electronics panel of the present invention is characterized in that: the sealing substrate is composed of a metal foil; and a polymer film is laminated on the metal foil surface on the reverse side of the side contacting the adhesive layer; a thickness of the polymer film is not more than a thickness of the metal foil; and heat is applied at a time of pasting and laminating the sealing substrate, or at a time of hardening the adhesive layer.

In hardening of a adhesive layer, the heating temperature is preferably in the range of 50° C. to 200° C., more preferable it is in the range of 80° C. to 160° C. By heating for 1 second to 1 hour, in the case of a heat curing resin, hardening (cross linkage reaction) progresses, and in the case of a thermoplastic resin, it plasticizes with heat at the time of pasting and laminating, and it is pasted to the element in the course of cooling. Moreover, also in the case of a photocurable adhesive agent, a hardening (adhesion) speed can be raised by carrying out simultaneously exposure of light and heating after pasting the sealing substrate.

In the present invention, a metal foil used for a sealing substrate has preferably a thickness of 9 to 500 µm, and a polymer film is laminated in the metal foil. The thickness of the polymer film is preferably 10 to 100% of the thickness of the metal foil.

Further, as the above-mentioned metallic foil, aluminium is preferable since it is inexpensive and flexible.

A surface roughness Ra of a surface without luster (a matt surface) of an aluminium foil is 10 nm or more, it is preferably 50 nm or more, and it is most preferably 100 nm or more. The surface roughness of the matt surface is preferably 0.8 µm or less, and more preferably it is 0.5 µm or less. When this value is small, peeling may occur easily in case of laminating a polymer film thereon. When this value is large, the surface of the element may be damaged in case of using the facing side of an electronics element. In addition, a glossy surface has a surface roughness Ra of less than 10 nm and it is a luster surface.

Figure 1:
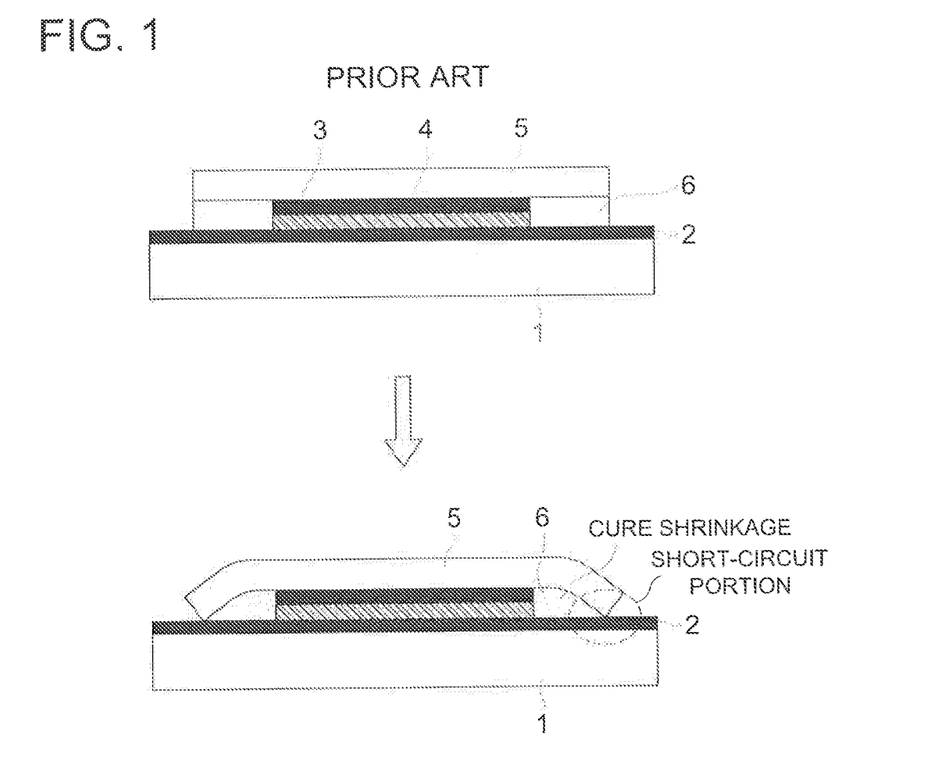
FIG. 1 is a cross-sectional view showing an example of an electronic panel having a conventional structure.

An example of an electronic panel having a conventional structure is shown with a cross-sectional view in FIG. 1.

FIG. 1 shows a sealed organic electronics panel which has a composition of an organic electronics element comprising a substrate 1 formed thereon a first electrode 2, an organic functional layer 3 such as a light emitting layer, and a second electrode 4, and the organic electronics element is sealed with a sealing substrate 5 at the edge portion of the sealing substrate through an adhesive layer 6.

As a result of investigating the cause of the electric short circuit which occurs when a metal foil (conductive sealing substrate) is used and a panel is produced with such composition as described above, it was found that the contact of the metal foil with the first electrode at the edges of these is the main cause of the short-circuit.

The above-described short-circuit at an edge portion occurs, for example, by the cure shrinkage of the adhesive agent at the time of sealing, and by pressure at the time of pasting of the sealing substrate. It may occur gradually with passage of time. Moreover, when each electronic panel is produced by punching out a large panel, a short-circuit will also occur, for example, by cutting by a cutter.

Although an example of an organic electronics panel of a conventional composition was shown in FIG. 1 with a cross-sectional view, FIG. 1 simultaneously shows the situation that a sealing substrate of a metal foil was bent at the end to the first electrode side to result in contacting a first electrode or a taking out electrode to form a short-circuit portion by cure shrinkage of an adhesive layer.

For example, if an insulating layer is given to the metal foil which is a conductive sealing substrate as described in Patent documents 1 or 2, it is effective. However, with respect to the edge of the sealing substrate, cutting is carried out, and a conductive part will be exposed again. Furthermore, in order to give an insulating layer to the edge portion, it is required that some kind of treatment is done to the sealing component. The cost will be increased and it is difficult to carry out such treatment.

As described in FIG. 1, an electric short-circuit will occur by the contact of the edge of the sealing substrate due to the warping of the sealing substrate to the electrode side by the cure shrinkage of the adhesive layer. The present inventors found out that the electric short-circuit will be reduced to a large extent by preventing the warping of the sealing substrate to the electrode side and thus the present invention has been achieved.

Therefore, the present invention has the distinctive feature in having prevented the warping (deformation) of the sealing substrate by the cure shrinkage at the time of hardening of the sealant, or by the stress at the time of pasting of the sealing substrate. Specifically, a polymer film is laminated on the metal foil surface (the metal foil being used as a sealing substrate) on the reverse side of the side contacting an adhesive layer (a reverse side: an opposite side contacting the adhesive layer). The short-circuit is controlled by preventing the warping of the sealing substrate to the first electrode by shrinking of the polymer film at the time of pasting and laminating with the sealing substrate or heating thereafter.

Therefore, the present invention is characterized in that a component produced by laminating a polymer film on a metal foil is used as a sealing substrate and this sealing substrate is heated.

Figure 2:
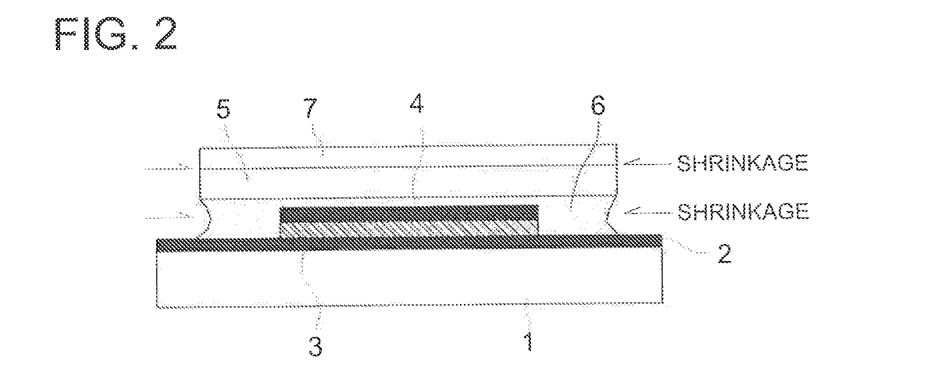
FIG. 2 is a schematic cross-sectional view showing an example of an electronic panel of the present invention.

The structure of an organic electronics panel of the present invention is shown in FIG. 2 with a schematic cross-sectioned view.

In contrast to the structure of FIG. 1, here, a component produced by laminating a polymer film on a metal foil is used as a sealing substrate. In addition to the aforesaid structure, a polymer film 7 is laminated to the metal foil 5. By this structure, the warping of the sealing substrate is prevented. The polymer film laminated on the metal foil which is provided on the reverse side of the side of the metal foil having the adhesive layer is shrunk moderately in proportion to the shrinkage of the adhesive layer at the time of hardening by heating, thereby the warping of the sealing substrate can be reduced substantially.

When the adhesive layer is a heat curing type, hardening of the adhesive layer and contraction of the polymer film can be made simultaneously by heating after pasting the sealing substrate. When the adhesive layer is a photo curing type, it can be made by carrying out an exposure of light and heating simultaneously after pasting the sealing substrate. When the adhesive layer is made of a thermoplastic resin, it can be made by pasting with heating the sealing substrate and the adhesive layer (by melting the adhesive layer).

In order to prevent the warping of a sealing substrate efficiently, it is desirable to select the relationship between the thickness of a metal foil and the thickness of a polymer film as follows.

That is, the metal foil used in the present invention as a sealing substrate has preferably a thickness of 9 to 500 µm. When the thickness is less than 9 µm, a pinhole may be easily formed at the time of use, and the barrier performance (a moisture vapor transmittance, and oxygen permeability) required may not be obtained.

Moreover, when the thickness exceeds 500 µm, the cost may become high depending on the material used for a metallic foil, or an organic electronics panel becomes thick and the merit of making a thin type will be decreased.

In these sealing substrates, in order to prevent a warping efficiently, it is preferable that the thickness of the polymer film does not exceed the thickness of the metal foil, and further it is preferable to make the thickness of the polymer film to be 10 to 100% of the thickness of the metal foil.

When the thickness of the polymer film is less than 10% of the thickness of the metal foil, the stress produced by the polymer film is too small to obtain a sufficient effect to control deformation of the metal foil.

On the other hand, when the thickness of the polymer film is larger than 100% of the thickness of the metal foil, the stress produced by the polymer film becomes large after thermal shrinkage, and the metal foil curves to the polymer film side (deformation), and there is a possibility that the peeling of the sealing substrate may arise at the adhesion edge portion.

A heat shrinking ratio of the polymer film is preferably 0.2 to 3% at the heating temperature at the time of pasting and laminating the sealing substrate, or at the time of hardening the adhesive layer. When this is 0.2% or less, a heat shrinking ratio is too small, and the effect of suppressing deformation (to the first electrode substrate side) of a metallic foil is small, and when it exceeds 3%, there is a possibility of the warping to the opposite side of the substrate becomes large, and may cause peeling of the sealing substrate itself.

A heat shrinking ratio can be measured by the following way.

(Heat Shrinking Ratio)

As a polymer film sample, three samples each, having 30 mm (width)×120 mm (length) are taken. Holes having a diameter of 6 mm are bored at both sides of each sample by punch at a 100 mm interval. Humidity control is done by leaving the prepared sample in a room at 23±3° C. and relative humidity of 65±5% for 3 hours or more. A full scale ($L_1$) of a punch interval is measured to the minimum graduation of 1,000 mm using an automatic pin gauge (made by SHNTO Scientific Co., Ltd.). Next, after hanging the sample in a thermostat set at the heating temperature at the time of hardening and heat-treating is carried out for 3 hours. Then, humidity control is done by leaving the sample in a room at 23±3° C. and relative humidity of 65±5% for 3 hours or more. The dimension ($L_2$) of the punch interval after heat treatment is measured by an automatic pin gauge. And a heat shrinking ratio is computed by the following formula.

Heat shrinking ratio=$((L_1-L_2)/L_1)\times 100$

For example, the heat shrinking ratio of PET is about 0.8% at 120° C.

It is preferable that Tg of the above-mentioned polymer film is lower than the heating temperature at the time of pasting and laminating the sealing substrate, or at the time of hardening of the adhesive layer. By this, a polymer film can be shrunk so as to follow the amount of the cure shrinkage of an adhesive agent. As a result, the difference of a heat shrinking ratio is decreased, and the deformation (curl and break) caused by hardening adhesion at an edge portion is decrease, and it becomes also difficult to produce a short-circuit part.

For example, since Tg is about 70° C. in the case of PET (polyethylene terephthalate), when a heat curing adhesive layer is used, it is convenient to set the heat curing temperature (heating temperature) to be 120° C.

When a metal foil is basted on a surface of an element to carry out sealing, it is preferable that the surface of the metallic foil facing to the adhesive layer side is a glossy surface (Ra is less than 10 nm). Since a smooth surface becomes located to the side of the organic electronics element, it is hard to give cause damage to the surface of the element which is sensitive to the pressure by a scratch or unevenness of a surface of the metal foil.

As a substrate of an organic electronics panel in the present invention, there can be cited a substrate such as a glass and a plastic, however, the present invention is not limited to only these.

There is a transparent resin film as a substrate material used as a plastic (resin) substrate. The transparent resin film having a thickness of about 100 μm to 2 mm is used. Examples of a transparent resin film include: polyethylene, ethylene-vinyl acetate copolymer, ethylene-vinyl alcohol copolymer, poly methyl mathacrylate, polyether ether ketone, polyether sulfone, tetrafluoroethylene perfluoro alkyl vinyl ether copolymer, polyester, polycarbonate, polyurethane, polyimide, and polyetherimide. The present invention is not limited to these.

Moreover, a gas barrier film having a high gas barrier property can also be used. As a gas banier film, it is cited a film having a sealing function with a thickness of 50 nm to 50 μm such as metal oxide film, oxidation nitride film, nitride film, and metal thin film. Specifically, it can be cited an alumina vapor deposited film, and a metal foil laminated with a resin film.

As a metal foil used as a sealing substrate, there is no limitation in particular to a kind of metal. For example, there can be cited: a copper (Cu) foil, an aluminium (Al) foil, a gold (Au) foil, a brass foil, a nickel (Ni) foil, a titanium (Ti) foil, a copper alloy foil, a stainless steel foil, a tin (Sn) foil, and a high nickel alloy foil. Among these various metal foils, an Al foil is cited as a most preferable metal foil.

Although a metal foil or a metal film formed by rolling is mainly pointed out as a metal foil, it may be a metal thin film formed by a sputter, or vacuum evaporation on a polymer film, or a conductive film formed from a fluid electrode material, such as a conductive paste.

It is possible to use various polymeric materials described in "New development of functional wrapping materials" (Toray Research Center, Inc.) as a polymer film material laminated with a metal foil.

Examples of such material include: a polyethylene resin, a polypropylene resin, a polyethylene terephthalate resin, a polyamide resin, an ethylene-vinyl alcohol copolymer resin, an ethylene-vinyl acetate copolymer resin, an acrylonitrile butadiene copolymer resin, a cellophane resin, a vinylon resin, and a vinylidene chloride resin.

The resins such as a polypropylene resin and a nylon resin may be extended, and they may be further coated with a vinylidene chloride resin. As a polyethylene resin, it can be used a low density type or a high density type.

The laminating machine generally used for the single side of a metal foil can be used as a method for laminating a polymer film. As an adhesive agent, it can be used, for example, a polyurethane system, a polyester system, an epoxy system, and an acrylic system. It may be used a hardener together if needed. Although a hot melt laminating method, an extrusion laminating method, and a co-extrusion laminating method can also be used, a dry laminate method is preferable. The thickness of an adhesive agent is preferably in the range of 0.5 to 10 μm.

When a metal foil is formed by a sputtering or a vapor evaporation, or it is formed from a fluid electrode material such as a conductive paste, a sealing substrate may be produced conversely by forming a metallic foil as a film on a polymer film used as a base material.

A thermocurable resin, a photocurable resin, a thermoplastic resin can be used for the adhesive layer used in the present invention. In the case of a curable resin, an epoxy resin, an acrylic resin, and a silicone resin are cited. The thickness of an adhesive layer is preferably 0.1 μm to 100 μm.

It is especially preferable to use an epoxy heat curable adhesive resin which excels in moisture resistance and water fastness with little contraction at the time of hardening.

In the case of a thermocurable adhesive, an adhesive agent is uniformly applied to the bonding surface of a sealing substrate, through the adhesive agent layer, the bonding surface is tightly stuck in such a manner of covering the substrate, and heat sticking by pressure is carried out to harden the adhesive agent, for example. What is necessary is just to stick the bonding surface in the range of 0.05 to 5 MPa. It is made to stick and hardens with heat.

In hardening the adhesive layer, the heating temperature is preferably in the range of 50° C. to 200° C., more preferably, it is in the range of 80° C. to 160° C. The heating temperature is preferably higher than Tg of the polymer film used for the sealing substrate. By heating for 1 second to 1 hour, a hardening reaction (cross linkage reaction) of the heat curing resin will be proceeded and pasting together will be performed.

Further, also in the case of a photocurable adhesive agent, a hardening (adhesion) speed can be raised by carrying out irradiation with light and applying heat simultaneously after pasting the sealing substrate.

In the case of a thermoplastic resin, the followings can be used: polyethylene, polypropylene, an acid modified compound of polyolefin such as an ethylene propylene copolymer, an acid modified compound of an ethylene-vinyl acetate copolymer, an ethylene acrylic acid copolymer, an ethylene methacrylic acid copolymer, and an ionomer. In particular, it is preferable to use an acid modified compound of polyethylene or polypropylene. It emits only a small amount of an out gas component which degrades an organic electronics element.

In the case of a thermoplastic adhesive, a thermoplastic adhesive (a thermoplastic resin) (for example, an acid modified compound of polypropylene, QE 050, made by Mitsui-Chemicals, Inc.) is laminated, for example, on the bonding surface (glossy surface) of the aluminium foil of the sealing substrate to form an adhesive layer. Subsequently, what is required is to heat and paste the sealing substrate to the substrate which has been formed an element in such a manner that the adhesive agent side is adhered closely in a laminated composition. The pressure at the time of pasting together is preferably in the range of 0.05 to 5 MPa. The heating temperature is preferably in the range of 50° C. to 200° C., more preferably, it is in the range of 80° C. to 160° C. The heating temperature is preferably higher than Tg of a polymer film used for the sealing substrate. In the case of a thermoplastic adhesive (resin), an element is pasted in the process of cooling after allowing to plasticize the resin with heat applied at the time of pasting and laminating.

As a method of forming an adhesive layer, there can be used the following methods according to the materials used: a roll coat, a spin coat, a screen printing, a coating method such as a spray coat, and a printing method. In order to remove the included water content inside the adhesive layer, it may mix a desiccant such as barium oxide or calcium oxide.

In the present invention, the sealing structure can be a hollow structure or a sealant loading close adhesion structure.

<<Organic EL Element>>

An organic EL element has a structure having a single or plural organic layers laminated between electrodes. It has the composition in which functional layers composed of a various kinds of organic compounds are laminated according to the need, an example of which is: anode layer/hole injection and transport layer/light emitting layer/electron injection and transport layer/cathode. Its simplest structure is: anode layer/light emitting layer/cathode.

As an organic material used for a hole injection and transport layer, there can be used: phthalocyanine derivative, heterocyclic azole, aromatic tertiary amine, polyvinyl carbazole, polymeric material such as a conductive polymer represented by polyethylene dioxythiophene/polystyrene sulfonic acid (PEDOT:PSS).

In a light emitting layer, there can be cited, for example: a low molecular light emitting material represented by a carbazole light emitting compound such as 4,4'-dicarbazolyl biphenyl and 1,3-dicarbazolylbenzene; (di)azacarbazole derivative; and a pyrene light emitting compound such as 1,3,5-tripyrenyl benzene, and a polymer compound represented by polyphenylene vinylene, polyfluorene, and polyvinyl carbazole. Among these, a low molecular light emitting material having a molecular weight of 10,000 or less is preferably used as a light emitting material.

In a light emitting layer, it may be preferably contained a dopant in an amount of 0.1 to 20 mass % as a light emitting material. Examples of a dopant include: a fluorescent dye such as a perylene derivative and a pyrene derivative; a phosphorescent dye such as an orthometalated iridium complex represented by tris(2-phenylpyridine)iridium, bis(2-phenylpyridine)(acetylacetonato)iridium, and bis(2,4-difluorophenylpyridine)(picolinate)iridium.

As an electron injection and transport layer material, there can be cited a metal complex compound such as lithium 8-hydroxyquinolinate and zinc bis(8-hydroxyquinolinate); and a nitrogen containing five membered ring derivative listed in the following. Namely, preferable are derivatives of oxazole, thiazole, oxadiazole, thiadiazole, and triazole. Specific examples thereof include: 2,5-bis(1-phenyl)-1,3,4-oxazole, 2,5-bis(1-phenyl)-1,3,4-thiazole, 2,5-bis(1-phenyl)-1,3,4-oxadiazole, 2-(4'-tert-butylphenyl)-5-(4"-biphenyl)-1,3,4-oxadiazole, 2,5-bis(1-naphthyl)-1,3,4-oxadiazole, 1,4-bis[2-(5-phenyloxadiazolyl)]benzene, 1,4-bis[2-(5-phenyl oxadiazolyl)-4-tert-butylbenzene)], 2-(4'-tert-butylphenyl)-5-(4"-biphenyl)-1,3,4-thiadiazole, 2,5-bis(1-naphthyl)-1,3,4-thiadiazole, 1,4-bis[2-(5-phenylthiadiazolyl)]benzene, 2-(4'-tert-butylphenyl)-5-(4"-biphenyl)-1,3,4-triazole, 2,5-bis(1-naphthyl)-1,3,4-triazole, and 1,4-bis[2-(5-phenyltriazolyl)]benzene.

As a material used in these light emitting layer and each functional layer, it is possible to include a compound having a polymerizable group in the molecule such as a vinyl group, and cross-linking polymerized film may be formed after film formation.

In this connection, as a conductive material used for an anode layer, a material having a work function larger than 4 eV is suitable. It can be used: silver, gold, platinum, palladium, and their alloy; metal oxide such as tin oxide, indium oxide, and ITO; an organic conductive resin such as polythiophene and polypyrrole.

As a conductive material used for a cathode layer, a material having a work function smaller than 4 eV is suitable. Representative examples are: magnesium and aluminium; and an alloy such as magnesium/silver, lithium/aluminium.

In an organic electronics panel, each of the above-mentioned functional layers may be formed by a dry process such as a vacuum deposition method and a sputtering method, and it may be formed by a wet process such as a coating method and a printing method.

<<An Organic Photoelectric Conversion Element>>

Next, an organic photoelectric conversion element will be described, however, the present invention is not limited to the following embodiments.

An organic photoelectric conversion element which can be used in the present invention is not limited in particular. It is sufficient that it is an element provided with an anode, a cathode, and a photoelectric conversion layer sandwiched between the anode and the cathode, and that it generates electricity when it is irradiated with light.

As a composition of a photoelectric conversion layer, it will not be limited especially if it is the composition in which an organic semiconductor material is laminated. For example, it can be cited: a hetero junction type laminated with a p-type semiconductor material and a n-type semiconductor material; and so-called a bulk hetero junction type prepared by mixing both types of semiconductor materials of p-type and n-type so as to have a micro phase separation structure in it. From the viewpoint of improvement in internal quantum efficiency, the composition excellent in charge separation efficiency is preferable. And a bulk hetero junction type structure is more preferable in the present invention.

When the organic photoelectric conversion element of the present invention is employed as a solar cell, it is preferable to use an organic semiconductor material which has the optimum absorption feature for a natural sunlight spectrum. It is preferable that the organic photoelectric conversion element has a black appearance from the viewpoints of efficiency and design properties.

<<Composition of Organic Photoelectric Conversion Element>>

An organic photoelectric conversion element which is applied with the present invention has a composition including a transparent electrode, a photoelectric conversion layer, and a counter electrode, all of which are laminated one by one in this order one side of the substrate.

The composition is not restricted to this. For example, the composition of the organic photoelectric conversion element may contain other layers, such as a hole transport layer, an electron transport layer, a hole blocking layer, an electron blocking layer, an electrode buffer layer, or a smoothing layer, between a transparent electrode, a counter electrode, and a photoelectric conversion layer. An electron transport layer may have a hole blocking property, and a hole transport layer may have an electron blocking property. Among them, in the organic photoelectric conversion element which has a photoelectric conversion layer of a bulk hetero junction type, it may have the following structure. There may be formed: a hole transport layer and/or an electron blocking layer between the photoelectric conversion layer and the anode (usually at a side of a transparent electrode); and an electron transport layer and/or a hole blocking layer between the photoelectric conversion layer and the cathode ((usually at a side of a counter electrode). By forming these layers, it becomes possible to take out efficiently the charge generated in the photoelectric conversion layer of a bulk hetero junction type. Therefore, this structure is preferable.

As the organic materials used for the above-mentioned hole transport layer and electron transport layer, the same kind of materials used for the aforesaid organic EL element can be used.

(i) anode/hole transport layer/electron blocking layer/photoelectric conversion layer/hole blocking layer/electron transport layer/cathode
(ii) anode/hole transport layer having an electron blocking property/photoelectric conversion layer/electron transport layer having a hole blocking property/cathode buffer layer/cathode
(iii) anode/anode buffer layer/hole transport layer/electron blocking layer/photoelectric conversion layer/hole blocking layer/electron transport layer/cathode
(iv) anode/anode buffer layer/hole transport layer/electron blocking layer/photoelectric conversion layer/hole blocking layer/electron transport layer/cathode buffer layer/cathode As mentioned above, an organic photoelectric conversion element is produced by piling up each layer in a multilayer composition on a substrate. In an organic photoelectric conversion element also, each of the above-mentioned functional layers may be formed using various known method in the art, for example, by a dry process such as a vacuum deposition method and a sputtering method, and by a wet process such as a coating method and a printing method.

Each of the above-mentioned functional layers is formed on the above-mentioned substrate, and sealing is carried out with a sealing substrate, and an organic electronics panel is composed.

EXAMPLES

The present invention will be specifically described by reference to the examples shown below, however, the present invention will not be limited to these.

Example 1

An Organic EL panel was prepared according to the composition of FIG. 2.
<Preparation of Organic EL Panel>
A transparent support substrate was prepared by making a 100 nm film of ITO (indium tin oxide) as an anode on a glass substrate of 100 mm×100 mm×1.1 mm. Thereafter, the above transparent support substrate was subjected to ultrasonic washing with isopropyl alcohol, followed by drying with desiccated nitrogen gas, and was subjected to UV ozone washing for 5 minutes.

On the transparent support substrate thus prepared was applied a 70% solution of poly(3,4-ethylenedioxythiphene)-polystyrene sulfonic acid (PEDOT/PSS, Baytron P AI 4083 made by Bayer AG.) diluted with water by using a spin coating method at 3,000 rpm for 30 seconds to form a film and then it was dried at 200° C. for one hour. A hole transport layer having a thickness of 30 nm was prepared.

Then, the following light emitting composition was prepared to obtain an amount of 1 ml, and it was applied thereon by using a spin coating method (to have a thickness of 25 nm).

Light Emitting Composition

| Solvent: toluene | 100 mass % |
| Host material: H-A | 1 mass % |
| Blue material: Ir-A | 0.10 mass % |
| Green material: Ir(ppy)$_3$ | 0.004 mass % |
| Blue material: Ir(piq)$_3$ | 0.005 mass % |

Then, a coating solution for an electron transport layer was prepared as described below, and it was applied by using a spin coating method at 1,500 rpm for 30 seconds to form an electron transport layer. Another coating was performed under the same condition on a substrate separately prepared, and the thickness of the film was measured to be 20 nm.

| (Coating solution for an electron transport layer) | |
| --- | --- |
| 2,2,3,3-Tetrafluoro-1-propanol | 100 ml |
| ET-A | 0.50 g |

Ir(ppy)$_3$

Ir(piq)$_3$

H-A

Ir-A

ET-A

Further, the above-described sample having been formed an electron transport layer was transferred in a vacuum deposition apparatus. After reducing the pressure of the vacuum tank to $4\times10^{-4}$ Pa, there were vapor deposited successively, 10 nm thick lithium fluoride as a cathode buffer layer and 110 nm thick aluminium as a cathode to prepare an organic EL element (Sealing Substrate)

Next, it was prepared an aluminium foil which was laminated with a polyester sheet.

An aluminium foil having a thickness of 50 μm (made by Toyo Aluminium K.K.) was used. On the matt surface (non-glossy surface) of this aluminium foil was laminated with a polyethylene terephthalate film having a different thickness (as indicated in Table 1) using an adhesive agent for dry lamination (a urethane adhesive agent of 2 liquid type; the thickness of the adhesive agent: 1.5 μm). Here, the surface roughness Ra of this matt surface (non-glossy surface) was 470 nm, and Ra of the glossy surface was not more than 1 nm.

(Preparation of Organic EL Panel)

Then, thus prepared PET laminated aluminium foil was cut in about the same size of the prepared glass substrate (100 mm×100 mm). On the glossy surface of the aluminium foil (the opposite side of the PET laminated side) was adhered the following heat curable adhesive agent. (Heat curable adhesive agent): Epoxy adhesive agent Bisphenol A Diglycidyl Ether (DGEBA)
Dicyandiamide (DICY)
Epoxy Adduct Curing Accelerator The heat curable adhesive agent was applied uniformly on the bonding surface (glossy surface) of the aluminium foil using a dispenser. Then, the bonding surface of the sealing substrate was located to stick closely and to cover the glass substrate having formed an organic EL element thereon in such a manner that the taking-out electrode was exposed. And, they were temporarily adhered with a pressure (pressure: 0.15 MPa; time: 30 seconds). The temporarily adhered organic EL panel was placed on a hot plate and heated (at temperature of 120° C. for 30 minutes) to heat cure the heat curable adhesive agent. Thus, it was prepared an organic EL panel. There were prepared Organic EL panels 2 to 7 using a PET film each having a different thickness.

In addition to Organic EL panel 7 (comparative sample), which used a sealing substrate of an aluminium foil having laminated with a 75 μm PET film, there was prepared Organic EL panel 1 which used a sealing substrate made of only an aluminium foil without laminating with a polyester sheet (thickness of PET: 0) as a comparative sample.

<Evaluation of Organic EL Panel>

To each taking-out electrode of the prepared Organic EL panels was impressed voltage of +5 V (forward direction) and −5 V (reverse direction) with a low voltage electric source (Direct current electric source: 86243, made by ADC Co., Ltd.). The electric current value at the time of impressing voltage was measured. The ratio of the positive-reverse electric current was calculated and comparison was made. Here, the ratio of the positive-reverse electric current indicates: (Positive electric current value) divided by (Reverse electric current value)=rectification ratio.

[Evaluation Ranks of Rectification Ratio]
A: 1,000 or more
B: 100 or more to less than 1,000
C: 10 or more to less than 100
D: less than 10

Further, peeling off at the edge portion of the sealing after heat curing was measured. Specifically, an amount of warping (rising up amount) of the edge portion of the sealing substrate toward the polymer film was measured using a height gauge. The obtained amount of warping was taken as amount of peeling off.

[Evaluation Ranks of Amount of Peeling Off]
A: less than 0.05 mm
B: 0.05 mm or more to less than 0.3 mm
C: 0.3 mm or more The obtained results are shown in Table 1.

TABLE 1

| Organic EL panel | Thickness of Aluminium foil μm | Thickness of PET (μm) | Thickness ratio of PET to Aluminium foil (%) | Rectification ratio | Amount of peeling off |
|---|---|---|---|---|---|
| 1 | 50 | 0 | 0 | D | — |
| 2 | 50 | 3 | 6 | C | — |
| 3 | 50 | 5 | 10 | B | A |
| 4 | 50 | 10 | 20 | A | A |
| 5 | 50 | 40 | 80 | A | A |
| 6 | 50 | 50 | 100 | B | B |
| 7 | 50 | 75 | 150 | B | C |

As shown by Table 1, it was found that the organic EL panel which was sealed with a metal foil exhibited a low rectification ratio and had a short circuit. Further, the organic EL panel which was prepared by using a metal foil laminated with a polymer film exhibited a good rectification ratio, and had a small amount of peeling off In addition, the organic EL panel which was prepared by using a metal foil only or the organic EL panel which was prepared by using a metal foil with a thin polymer film exhibited no peeling off from the glass substrate (here, an amount of peeling off was indicated as "-"). When the thickness of polymer film became large, an amount of peeling off became large, and the peeling can be visually observed at the edge portion. Thus the effectiveness of the present invention was confirmed. The organic EL panel whose thickness ratio of PET to aluminium was 20 to 80% was particularly effective.

Example 2

An Organic EL panel was prepared according to the composition of FIG. 2 in the same manner as Example 1.
<Preparation of Organic EL Panel>
In the same manner as Example 1, on a glass substrate of 100 mm×100 mm×1.1 mm were prepared an anode, a hole transport layer, a light emitting composition, an electron transport layer, a cathode buffer layer, and cathode in that order to prepare an organic EL panel.
(Sealing Substrate)
Next, it was prepared an aluminium foil which was laminated with a polyester sheet.
An aluminium foil having a thickness of 50 μm (made by Toyo Aluminium K.K.) was used. On the matt surface of this aluminium foil was laminated with a polyethylene terephthalate film having a thickness of 25 μm using an adhesive agent for dry lamination (a urethane adhesive agent of 2 liquid type; the thickness of the adhesive agent: 1.5 μm). Here, the surface roughness Ra of this matt surface (non-glossy surface) was 470 nm, and Ra of the glossy surface was not more than 1 nm.
Then, on the bonding surface (glossy surface) of thus prepared PET laminated aluminium foil was extrusion-laminated with a thermoplastic adhesive agent (an acid modified polypropylene, QE 050 made by Mitsui Chemicals, Inc.) to form an adhesive layer. The thickness of the thermoplastic adhesive agent was made to be 30 μm.
(Preparation of Organic EL Panel)
Then, thus prepared PET laminated aluminium foil provided with an adhesive layer was cut in about the same size of the prepared glass substrate (100 mm×100 mm). Then, the bonding surface of the sealing substrate was located to stick closely and to cover the glass substrate having formed an organic EL element thereon in such a manner that the taking-out electrode was exposed. And, they were adhered with a pressure. The pressure of adhesion was 0.15 MPa, and the time for adhesion was 30 seconds. The heating temperature for adhesion was varied (indicated in Table 2). Thus, Organic EL panels 8 to 14 were prepared by using a condition of a different PET film shrinking ratio.
<Evaluation of Organic EL Panel>
To each taking-out electrode of the prepared Organic EL panels was impressed voltage of +5 V (forward direction) and −5 V (reverse direction) with a low voltage electric source (Direct current electric source: R6243, made by ADC Co., Ltd.). The electric current value at the time of impressing voltage was measured. The ratio of the positive-reverse electric current was calculated and comparison was made. Here, the ratio of the positive-reverse electric current indicates:
(Positive electric current value) divided by (Reverse electric current value)=rectification ratio.
[Evaluation Ranks of Rectification Ratio]
A: 1,000 or more
B: 100 or more to less than 1,000
C: 10 or more to less than 100
D: less than 10
Further, peeling off at the edge portion of the sealing after heat curing was measured. Specifically, an amount of warping (rising up amount) of the edge portion of the sealing substrate toward the polymer film was measured using a height gauge. The obtained amount of warping was taken as amount of peeling off.
[Evaluation Ranks of Amount of Peeling Off]
A: less than 0.05 mm
B: 0.05 mm or more to less than 0.3 mm
C: 0.3 mm or more
The obtained results are shown in Table 2.

TABLE 2

| Organic EL Panel | Heating temperature at the time of adhesion (° C.) | PET shrinking ratio (%) | Rectification ratio | Amount of peeling off |
| --- | --- | --- | --- | --- |
| 8 | 90 | 0.1 | C | — |
| 9 | 100 | 0.2 | B | A |
| 10 | 120 | 0.8 | A | A |
| 11 | 130 | 1.5 | A | A |
| 12 | 140 | 3 | A | A |
| 13 | 150 | 3.5 | B | B |
| 14 | 160 | 4 | B | B |

As shown by Table 2, it was found that the organic EL panel having a small amount of PET shrinking ratio exhibited a low rectification ratio and had a short circuit. The organic EL panel having a PET shrinking ratio of 0.2% or more exhibited a high rectification ratio and had no short circuit. When the PET shrinking ratio exceeds 3%, an amount of warping at the edge portion of the sealing component became large and peeling off was observed. Thus the effectiveness of the present invention was confirmed. In particular, it was effective when the PET shrinking ratio was 0.8 to 3.

Example 3

An Organic photoelectric conversion panel was prepared according to the composition of FIG. 2.
<Preparation of Organic Photoelectric Conversion Panel>
A transparent support substrate was prepared by making a 100 nm film of ITO (indium tin oxide) as an anode on a glass substrate of 100 mm×100 mm×1.1 mm. Thereafter, the above transparent support substrate was subjected to ultrasonic washing with isopropyl alcohol, followed by drying with desiccated nitrogen gas, and was subjected to UV ozone washing for 5 minutes.
On the transparent support substrate thus prepared was applied a solution of poly(3,4-ethylenedioxythiphene)-polystyrene sulfonic acid (PEDOT/PSS, Baytron P AI 4083 made by Bayer AG.) by using a spin coating method so as to have a thickness of 30 nm after drying. The coating was dried at 140° C. for 10 minutes under the atmosphere. The application process was carried out under the atmosphere at 25° C. with a relative humidity of 50%.
After this, the substrate was transferred into a glove box and the operation was done under the nitrogen atmosphere.
First, the above-mentioned substrate was heat-treated at 140° C. for 3 minutes under the nitrogen atmosphere.

Next, there was prepared a mixed solution of P3H (regio-regular poly-3-hexylthiohene, made by Prectronics Co., Ltd.) and PCBM (6,6-phenyl-$C_{61}$-butylic acid methyl ester, made by Frontier Carbon Co., Ltd.) in chlorobenzene with a mixing ratio of 1:0.8 so that it become 3.0 mass %. While filtering the solution, the prepared solution was applied so that the coating thickness might become 100 nm, and it was dried by leaving at room temperature. Continuously, heat-treatment was performed for 15 minutes at 150° C., and a photoelectric conversion layer was formed.

Next, the substrate having been formed a series of functional layers as described above was transferred in a chamber of a vacuum deposition apparatus. After reducing the pressure of the chamber of the vacuum deposition apparatus to $4 \times 10^{-4}$ Pa, there were vapor deposited successively, 0.6 nm thick lithium fluoride at a vapor deposition speed of 0.01 nm/second, and 100 nm thick Al metal on it at a vapor deposition speed of 0.2 nm/second thorough a shadow mask having a width of 2 mm (so that a light receiving portion became 2×2 mm) to form a counter electrode. Thus an organic photoelectric conversion element was prepared.

(Sealing Substrate)

Next, it was prepared an aluminium foil which was laminated with a polyester sheet.

An aluminium foil having a thickness of 50 μm (made by Toyo Aluminium K.K.) was used. On the matt surface of this aluminium foil was laminated with a polyethylene terephthalate film having a different thickness (as indicated in Table 3) using an adhesive agent for dry lamination (a urethane adhesive agent of 2 liquid type; the thickness of the adhesive agent: 1.5 μm). Here, the surface roughness Ra of this matt surface (non-glossy surface) was 470 nm, and Ra of the glossy surface was not more than 1 nm.

(Preparation of Organic Photoelectric Conversion Panel)

Then, thus prepared PET laminated aluminium foil was cut in about the same size of the prepared glass substrate (100 mm×100 mm). On the glossy surface of the aluminium foil (the opposite side of the PET laminated side) was adhered the following heat curable adhesive agent.

(Heat Curable Adhesive Agent): Epoxy Adhesive Agent
    Bisphenol A diglycidyl ether (DGEBA)
    Dicyandiamide (DICY)
    Epoxy adduct curing accelerator The heat curable adhesive agent was applied uniformly on the bonding surface (glossy surface) of the aluminium foil using a dispenser. Then, the bonding surface of the sealing substrate was located to stick closely and to cover the glass substrate having formed an organic photoelectric conversion element thereon in such a manner that the taking-out electrode was exposed. And, they were temporarily adhered with a pressure (pressure: 0.15 MPa; time: 30 seconds). The temporarily adhered organic photoelectric conversion panel was placed on a hot plate and heated (at temperature of 120° C. for 30 minutes) to heat cure the heat curable adhesive agent. Thus, it was prepared an organic photoelectric conversion panel. There were prepared Organic photoelectric conversion panels SP2 to SP7 using a PET film each having a different thickness.

In addition to Organic photoelectric conversion panel SP7 (comparative sample), which used a sealing substrate of an aluminium foil having laminated with a 75 μm PET film, there was prepared Organic photoelectric conversion panel SP1 which used a sealing substrate made of only an aluminium foil without laminating with a polyester sheet (thickness of PET: 0) as a comparative sample.

<Evaluation of Organic Photoelectric Conversion Panel>

To each taking-out electrode of the prepared Organic photoelectric conversion panels was impressed voltage of +5 V (forward direction) and −5 V (reverse direction) with a low voltage electric source (Direct current electric source: R6243, made by ADC Co., Ltd.). The electric current value at the time of impressing voltage was measured. The ratio of the positive-reverse electric current was calculated and comparison was made. Here, the ratio of the positive-reverse electric current indicates: (Positive electric current value) divided by (Reverse electric current value)=rectification ratio.

To each taking-out electrode of the prepared Organic photoelectric conversion panels was impressed voltage of +1 V (forward direction) and −1 V (reverse direction) with a low voltage electric source (Direct current electric source: R6243, made by ADC Co., Ltd.). The electric current value at the time of impressing voltage was measured. The ratio of the positive-reverse electric current was calculated and comparison was made. Here, the ratio of the positive-reverse electric current indicates: (Positive electric current value) divided by (Reverse electric current value)=rectification ratio.

[Evaluation Ranks of Rectification Ratio]
    A: 1,000 or more
    B: 100 or more to less than 1,000
    C: 10 or more to less than 100
    D: less than 10

Further, peeling off at the edge portion of the sealing after heat curing was measured. Specifically, an amount of waning (rising up amount) of the edge portion of the sealing substrate toward the polymer film was measured using a height gauge. The obtained amount of warping was taken as amount of peeling off.

[Evaluation Ranks of Amount of Peeling Off]
    A: less than 0.05 mm
    B: 0.05 mm or more to less than 0.3 mm
    C: 0.3 mm or more The obtained results are shown in Table 3.

TABLE 3

| Organic photoelectric conversion panel | Thickness of Aluminium foil (μm) | Thickness of PET (μm) | Thickness ratio of PET to Aluminium foil (%) | Rectification ratio | Amount of peeling off |
|---|---|---|---|---|---|
| SP1 | 50 | 0 | 0 | D | — |
| SP2 | 50 | 3 | 6 | C | — |
| SN3 | 50 | 5 | 10 | B | A |
| SN4 | 50 | 10 | 20 | A | A |
| SP5 | 50 | 40 | 80 | A | A |
| SP6 | 50 | 50 | 100 | B | B |
| SP7 | 50 | 75 | 150 | B | C |

As shown by Table 3, it was found that the organic photoelectric conversion panel which was sealed with a metal foil exhibited a low rectification ratio and had a short circuit. Further, the organic EL panel which was prepared by using a metal foil laminated with a polymer film exhibited a good rectification ratio, and had a small amount of peeling off. In addition, the organic photoelectric conversion panel which was prepared by using a metal foil only or the organic photoelectric conversion panel which was prepared by using a metal foil with a thin polymer film exhibited no peeling off from the glass substrate. When the thickness of polymer film became large, an amount of peeling off became large, and the peeling can be visually observed at the edge portion. In the same way as Example 1, the effectiveness of the present invention was confirmed. The organic photoelectric conversion panel whose thickness ratio of PET to aluminium was 20 to 80% was particularly effective.

Example 4

An organic EL panel was prepared in the same manner as Example 1, except that a glass substrate for an organic EL panel was substituted with a polyethylene naphthalate (PEN) having a thickness of 125 μm as a substrate. The same evaluations were carded out as in Example 1. It was found that, even in the case of using a plastic substrate, substantially the same results as Example 1 were obtained.

Example 5

An organic EL panel was prepared in the same manner as Example 2, except that a glass substrate for an organic EL panel was substituted with a polyethylene naphthalate (PEN) having a thickness of 125 μm as a substrate. The same evaluations were carried out as in Example 2. It was found that even in the case of using a plastic substrate, substantially the same results as Example 2 were obtained.

Example 6

An organic photoelectric conversion panel was prepared in the same manner as Example 3, except that a glass substrate for an organic photoelectric conversion panel was substituted with a polyethylene naphthalate (PEN) having a thickness of 125 μm as a substrate. The same evaluations were carried out as in Example 3. It was found that, even in the case of using a plastic substrate, the effects to the organic photoelectric conversion panel were the same, and the same results as Example 3 were obtained.

DESCRIPTION OF SYMBOLS

1: Substrate
2: First electrode
3: Organic functional layer
4: Second electrode
5: Sealing substrate
6: Adhesive layer
7: Polymer film

The invention claimed is:

1. An organic electronics panel formed by pasting and laminating a sealing substrate via an adhesive layer on an organic electronics element comprising a substrate having thereon at least: an anode layer including a first electrode; an organic layer; and a cathode layer including a second electrode, wherein the sealing substrate is composed of a metal foil, a polymer film being laminated on a reverse side of the metal foil opposite a side of the metal foil contacting the adhesive layer; a thickness of the polymer film is not more than a thickness of the metal foil; and heat is applied at a time of pasting and laminating the sealing substrate, or at a time of hardening the adhesive layer, and a heat shrinking ratio of the polymer film is 0.2% to 3% at the time of hardening the adhesive layer.

2. The organic electronics panel of claim 1, wherein the organic layer includes a light emitting layer, and the organic electronics element is an organic electroluminescence element.

3. The organic electronics panel of claim 1, wherein the organic layer includes photoelectric conversion layer, and the organic electronics element is an organic photoelectric conversion element.

4. The organic electronics panel of claim 1, wherein the thickness of the metal foil is 9 to 500 μm, and the thickness of the polymer film is 10 to 100% of the thickness of the metal foil.

5. The organic electronics panel of claim 1, wherein the metal foil is made of aluminium.

6. The organic electronics panel of claim 1, wherein, the metal foil is made of aluminium, and the side of the metal foil contacting the adhesive layer is a glossy surface.

7. The organic electronics panel of claim 1, wherein Tg of the polymer film is lower than the heating temperature at the time of pasting and laminating the sealing substrate, or at the time of hardening the adhesive layer.

8. A method for producing an organic electronics panel comprising:
    pasting and laminating a sealing substrate via an adhesive layer on an organic electronics element comprising a substrate having thereon at least: an anode layer including a first electrode; an organic layer; and cathode layer including, second electrode, wherein the sealing substrate is composed of a metal foil, a polymer film being laminated on a reverse side of the metal foil opposite a side of the metal foil contacting the adhesive layer; a thickness of the polymer film is not more than a thickness of the metal foil; and heat is applied at a time of pasting and laminating the sealing substrate, or at a time of hardening the adhesive layer; and a heat shrinking ratio of the polymer film is 0.2% to 3% at the time of pasting and laminating the sealing substrate, or at the time of hardening the adhesive layer.

9. The organic electronics panel of claim 1, wherein the heat shrinking ratio of the polymer film is 0.8% to 3% at the time of pasting and laminating the sealing substrate, or at the time of hardening the adhesive layer.

* * * * *